(12) United States Patent
Zhou et al.

(10) Patent No.: US 9,964,864 B2
(45) Date of Patent: May 8, 2018

(54) SILICON WAFER EDGE PROTECTION DEVICE

(71) Applicant: SHANGHAI MICRO ELECTRONICS EQUIPMENT (GROUP) CO., LTD., Shanghai (CN)

(72) Inventors: Xu Zhou, Shanghai (CN); Haicang Cui, Shanghai (CN); Fei Ni, Shanghai (CN); Lili Ge, Shanghai (CN)

(73) Assignee: SHANGHAI MICRO ELECTRONICS EQUIPMENT (GROUP) CO., LTD., Shanghai (CN)

(*) Notice: Subject to any disclaimer, the term of this patent is extended or adjusted under 35 U.S.C. 154(b) by 0 days. days.

(21) Appl. No.: 15/541,331

(22) PCT Filed: Dec. 27, 2015

(86) PCT No.: PCT/CN2015/099084
§ 371 (c)(1),
(2) Date: Jun. 30, 2017

(87) PCT Pub. No.: WO2016/107507
PCT Pub. Date: Jul. 7, 2016

(65) Prior Publication Data
US 2017/0357162 A1      Dec. 14, 2017

(30) Foreign Application Priority Data

Dec. 30, 2014  (CN) .......................... 2014 1 0857409

(51) Int. Cl.
*G03B 27/58*      (2006.01)
*G03F 7/20*       (2006.01)

(52) U.S. Cl.
CPC .......... *G03F 7/70725* (2013.01); *G03F 7/709* (2013.01); *G03F 7/70758* (2013.01); *G03F 7/70766* (2013.01)

(58) Field of Classification Search
CPC ............. G03F 7/70725; G03F 7/70691; G03F 7/70733; G03F 7/7075; G03F 7/70758;
(Continued)

(56) References Cited

U.S. PATENT DOCUMENTS

| 6,440,219 B1* | 8/2002 | Nguyen | ................ C23C 16/042 |
| | | | 118/503 |
| 2001/0004105 A1* | 6/2001 | Kwan | ................. G03F 7/70716 |
| | | | 250/492.2 |

(Continued)

FOREIGN PATENT DOCUMENTS

| CN | CN102012639 A | 4/2011 |
| CN | CN102141735 A | 8/2011 |

(Continued)

OTHER PUBLICATIONS

English translation of CN 102012639, published Apr. 13, 2011.*

*Primary Examiner* — Christina Riddle
(74) *Attorney, Agent, or Firm* — Muncy, Geissler, Olds & Lowe, P.C.

(57) ABSTRACT

A silicon wafer edge protection device having: a horizontal motion assembly; vertical motion assembly; speed regulating device, which is in signal connection with the vertical motion assembly and used for regulating vertical motion assembly motion speed; flexible bumper assembly, which is connected to the horizontal motion assembly and vertical motion assembly and used for reducing the amplitude of vibration of the silicon wafer edge protection device when a collision occurs; and control device, which is in signal connection with the speed regulating device and used for sending a control signal to the speed regulating device to control motion of the vertical motion assembly. The silicon wafer edge protection device can prevent a wafer stage from undergoing an instantaneous strong impact and prevent a silicon wafer from being crushed. When a collision occurs, (Continued)

the wafer stage and the silicon wafer can be protected. Production efficiency is also improved.

17 Claims, 5 Drawing Sheets

(58) Field of Classification Search
CPC ............ G03F 7/70766; G03F 7/70775; G03F 7/70858; G03F 7/709; G03F 7/70808; G03F 7/70816; G03F 7/70825
USPC ........... 355/53, 72–75, 77; 250/492.1, 492.2, 250/492.22, 493.1, 548
See application file for complete search history.

(56) References Cited

U.S. PATENT DOCUMENTS

| 2005/0007574 | A1* | 1/2005 | Van Der Meulen ............... G03F 7/70716 355/72 |
| 2007/0216881 | A1* | 9/2007 | Van Der Schoot .... G03B 27/42 355/53 |

FOREIGN PATENT DOCUMENTS

| CN | CN103293862 A | 9/2013 |
| CN | CN103901733 A | 7/2014 |
| CN | 203774252 U | 8/2014 |
| JP | H11297587 A | 10/1999 |

* cited by examiner

SILICON WAFER EDGE PROTECTION DEVICE

TECHNICAL FIELD

The present invention relates to the field of semiconductor fabrication and, in particular, to a silicon wafer edge protection device.

BACKGROUND

Photolithography tools are primarily used for the manufacture of integrated circuits (IC) or other micro devices. With a photolithography tool, a reticle pattern can be imaged onto a wafer coated with photoresist. In the photolithography tool, a projection objective is employed to expose the reticle pattern so that the latter is transferred into the photoresist. As a key component of the photolithography tool, a wafer edge protection device plays an important role in edge protection for wafers coated with negative photoresist during exposure.

There are two types of photoresist, also known as resist or sensitizer: positive photoresist, in which the portion exposed to light becomes soluble to the photoresist developer; and negative photoresist, in which the unexposed portion is dissolved by the photoresist developer. Wafer edge protection devices are designed for photolithography processes using negative photoresist.

In conventional wafer edge protection devices, a protective ring is utilized to shield a wafer edge so as to protect the wafer edge from being exposed. Such a protective ring is a centrally hollow, peripherally solid optical shield. Such a wafer edge protection device includes a mechanical assembly for transport of the protective ring and a control module. When a wafer stage of the photolithography tool with a wafer carried thereon is moved to a location under the wafer edge protection device for protective ring transfer, the mechanical assembly will transfer the protective ring onto the wafer stage or pick it up therefrom under the control of the control module. Referring to FIGS. 3a and 4a, this conventional wafer edge protection device does not have any speed control device, and the mechanical assembly is enabled to move vertically under the effect of the pressure of a gas within an air cylinder, which is regulated by a switch valve of the gas supply. The switch valve is actuated by a switch signal that is directly output from the aforementioned control module to the valve. During downward movement of the mechanical assembly, it first accelerates to reach a velocity V1 at a time instant t1 and then moves constantly at a constant velocity equal to V1. When the mechanical assembly collides with the wafer stage on which a wafer is supported, the great impact from the collision may cause damages in the wafer and wafer stage.

Therefore, in order to protect the wafer and wafer stage from damages in the tight space inside the photolithography tool, critical requirements are placed on the safety and reliability of the wafer edge protection device. In particular, during a testing, if the wafer edge protection device is positioned improperly relative to the wafer stage, it is likely to exert a strong impact on the latter instantaneously when colliding therewith, as shown in FIG. 6a, in which the vertical axis A represents amplitude measured in hertz (Hz), and the horizontal axis t represents the time measured in second (s). A strong vibration signal generated from the collision indicates the instantaneous strong impact which may cause permanent damages in structure and performance of the wafer stage as well as vibration or even crushing of the wafer. While the impact from the wafer edge protection device on the wafer and wafer stage can be mitigated by reducing the vertical speed of the wafer edge protection device, a reduction in productivity will be resulted.

In another wafer edge protection device proposed in the prior art, a single power source is used to provide multiple synchronized forces by which a linear displacement is converted into multiple equal radial displacements. As a result, transfer of protective ring is accomplished with less power source consumption and a high degree of synchronization. However, this wafer edge protection device does not provide any protection against possible collisions during operation, leaving the wafer stage exposed to potential safety risks.

SUMMARY OF THE INVENTION

It is an object of the present invention to provide a wafer edge protection device for increased safety and protection of wafer stages and wafers.

In order to achieve the above object, the subject matter of the present invention is a wafer edge protection device, comprising: a horizontal motion assembly; a vertical motion assembly; a speed control device, which is signal-connected to the vertical motion assembly and configured to adjust a speed of the vertical motion assembly; a flexible bumper assembly for connecting the horizontal motion assembly to the vertical motion assembly, configured to reduce an amplitude of vibration of the wafer edge protection device caused by a collision; and a control device, which is signal-connected to the speed control device and configured to output a control signal to the speed control device so as to control a movement of the vertical motion assembly.

Preferably, the wafer edge protection device further comprises a collision signal detection and protection assembly configured to detect a vibration signal of the horizontal motion assembly relative to the vertical motion assembly and to generate a warning signal and a protection signal based on the vibration signal. The collision signal detection and protection assembly is signal-connected to the control device, and the control device receives the warning and the protection signals and, based on the signal, outputs the control signal to the speed control device so as to control the movement of the vertical motion assembly.

Preferably, the horizontal motion assembly comprises: a securing disk; a triple-eccentric cam secured to the securing disk through a bearing, wherein at least one eccentric groove is evenly provided in the triple-eccentric cam; a horizontal cylinder having a first end in connection with the securing disk and a second end in connection with the triple-eccentric cam; at least one cam follower disposed in the at least one eccentric grooves in the triple-eccentric cam; and at least one protective clamp received in the securing disk, each of the at least one protective clamp having a first end in fixed connection with a corresponding one of the at least one cam follower and a second end for pick-up or release of a protective ring.

Preferably, the horizontal cylinder has a first end coupled to the securing disk through a first hinge shaft and a second end coupled to the triple-eccentric cam through a second hinge shaft.

Preferably, the vertical motion assembly has a top end, coupled to a vertical fixation member and a bottom end coupled, via an adapter plate assembly, to the flexible bumper assembly.

Preferably, the vertical motion assembly is a vertical cylinder.

Preferably, the speed control device is a servo valve provided on a gas supply.

Preferably, the flexible bumper assembly comprises a flexible sheet and a stop assembly for positionally limiting the flexible sheet. The flexible sheet is in connection with the vertical motion assembly and is in fixed connection with the horizontal motion assembly.

Preferably, the flexible sheet is connected to the vertical motion assembly through of an adapter plate assembly.

Preferably, the stop assembly comprises at least two stopper rods, each of the at least two stopper rods having a bottom end in fixed connection with the horizontal motion assembly, the at least two stopper rods penetrating upward successively through the flexible sheet and the adapter plate assembly and being provided with a check nut at the top end thereof.

Preferably, the at least two stopper rods are provided evenly in the periphery of the flexible sheet.

Preferably, a stop washer is provided around an upper portion of each of the at least two stopper rods.

Preferably, the flexible sheet is circular, wherein a plurality of ribs arranged in a circular shape are provided on at least one surface of the flexible sheet, and wherein an inside portion of the flexible sheet that is encircled by the plurality of ribs is fixedly coupled to the adapter plate assembly and an outside portion of the flexible sheet that is external to the plurality of ribs is fixedly coupled to the horizontal motion assembly.

Preferably, a plurality of outer holes are formed external to the plurality of ribs and a plurality of inner holes are formed internal to the plurality of ribs. Additionally, the flexible sheet is fixedly coupled to the adapter plate assembly through a plurality of first screws at the plurality of outer holes and to the horizontal motion assembly through a plurality of second screws at the plurality of inner holes.

Preferably, each of the plurality of ribs is fan-shaped.

Preferably, the collision signal detection and protection assembly comprises at least one collision sensor signal-connected to both the horizontal motion assembly and the vertical motion assembly.

Preferably, the at least one collision sensor is fixed to the wafer edge protection device by means of at least one sensor holder.

In the wafer edge protection device according to the present invention, the speed control device is incorporated for speed control for the vertical motion assembly. With the aid of the speed control device, the control device controls the vertical motion assembly to accelerate to a certain speed and then maintains this speed. Upon the horizontal motion assembly reaching a position close to the wafer stage under actuation of the vertical motion assembly, it is decelerated so that when the horizontal motion assembly moves to a position closely above the wafer stage, the speed of the vertical motion assembly has experienced a significant decrease, leading to reductions in the probability of, and the impact from, collision between the horizontal motion assembly and the wafer stage. This prevents the application of an instantaneous strong impact by the horizontal motion assembly on the wafer stage and achieves reduced amplitude of vibration of the wafer edge protection device, thereby avoiding crushing of the wafer by the horizontal motion assembly. Compared with the arrangement without any speed control device, the speed control device allows a significantly increased constant speed of the vertical cylinder which results in a higher productivity. Therefore, incorporation of the speed control device can provide protection for the wafer stage and wafer while ensuring a satisfactory productivity.

The flexible bumper assembly can reduce amplitude of vibration of the wafer edge protection device caused by, and the impact from, collision between the horizontal motion assembly and the wafer stage, thus preventing the application of an instantaneous strong impact on the wafer stage as well as crushing of the wafer by the horizontal motion assembly.

The collision signal detection and protection assembly is provided to detect vibration of the horizontal motion assembly with respect to the vertical motion assembly. If the vibration is below a threshold, the wafer edge protection device is left operating normally. When the vibration exceeds the threshold, vibration occurrence is determined and the collision signal detection and protection assembly generates a warning signal and a protection signal. The control device raises an alarm when receiving the warning signal. Further, the control device is also designed to receive the protection signal and control, with the aid of the speed control device, the wafer edge protection device to take a protective action for stopping the movement toward collision. As such, the wafer stage will be protected and the wafer will not be crushed.

In the figures, 1 denotes a vertical motion assembly; 2, a vertical fixation member; 3, a collision sensor; 4, a protective ring; 5, a protective clamp; 6, a sensor holder; 7, a securing disk; 8, a flexible sheet; 8-1, outer holes; 8-2, ribs; 8-3, inner holes; 8a, a steady state of the flexible sheet; 8b, a state in which the flexible sheet accelerates downward or subject to a collision; 8c, a state in which the flexible sheet accelerates upward; 9, an adapter plate assembly; 10, stopper rods; 11, a stop washer; 12, a check nut; 13, a horizontal cylinder; 14, a first hinge shaft; 15, a second hinge shaft; 16, a triple-eccentric cam; 17, a cam follower; 18, a bearing; 19, a gas supply; and 20, speed control device.

DETAILED DESCRIPTION

The present invention will be described below in detail with reference to the accompanying drawings.

Figure 1:
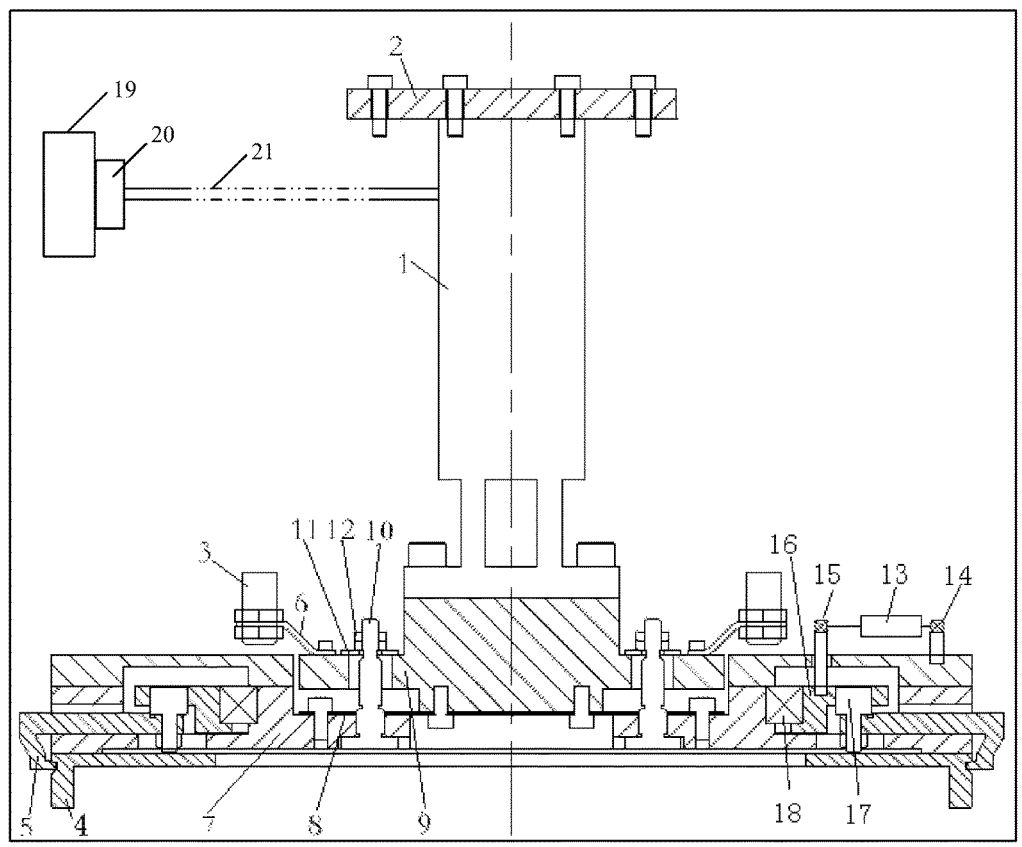
FIG. 1 is an elevation view of a wafer edge protection device according to an embodiment of the present invention.
Figure 2:
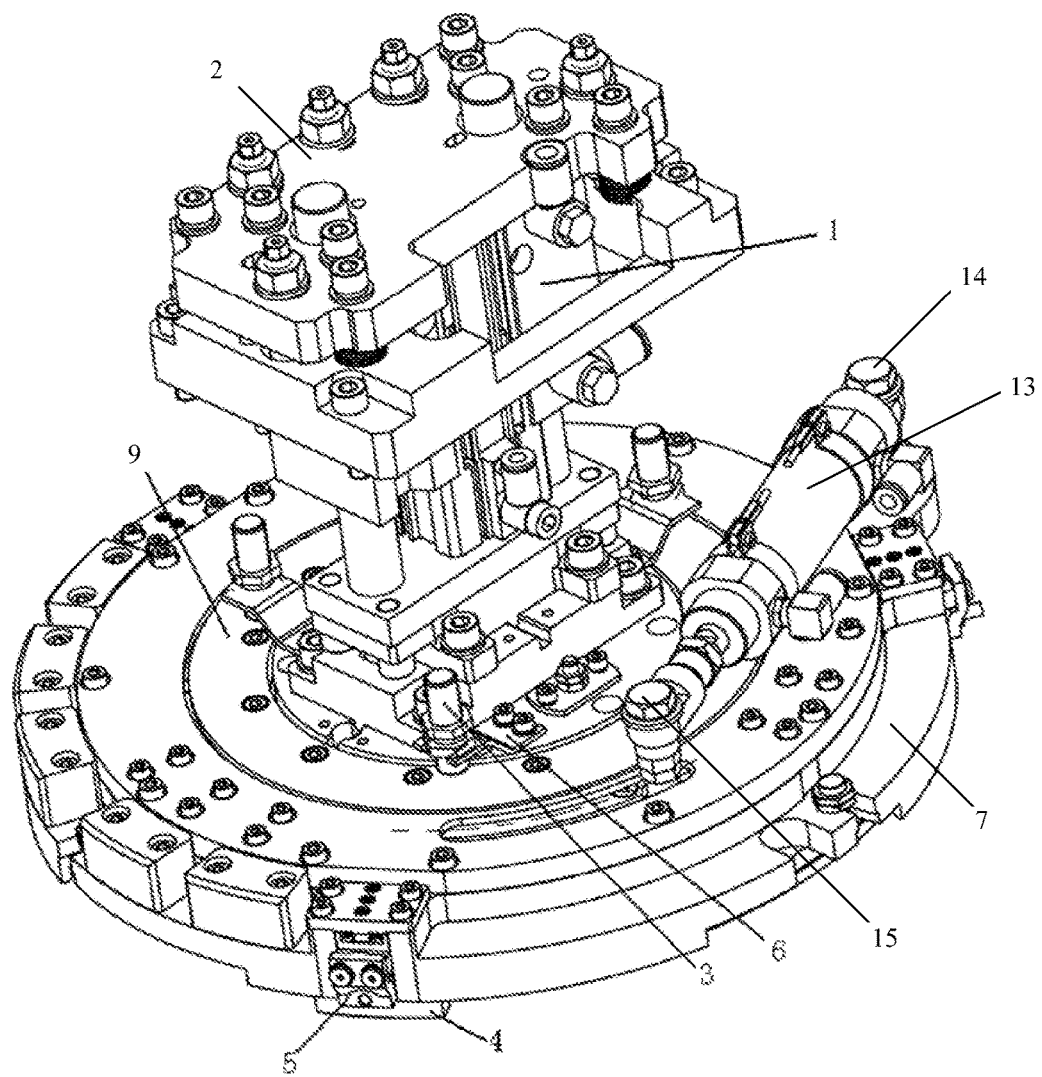
FIG. 2 is a perspective view of a wafer edge protection device according to an embodiment of the present invention.

Referring to FIGS. 1 and 2, a wafer edge protection device comprises: a horizontal motion assembly; a vertical motion assembly 1; a speed control device 20 configured to adjust a speed of the vertical motion assembly 1; a flexible bumper assembly connecting the horizontal motion assembly to the vertical motion assembly 1, configured to reduce the amplitude of vibration of the wafer edge protection device caused by collision; a collision signal detection and protection assembly configured to detect a signal indicating vibration of the horizontal motion assembly relative to the vertical motion assembly 1 and to generate a warning signal and a protection signal based on the vibration signal; and a control device (not shown) which is signal-connected to the speed control device 20 and is configured to output a control signal to the speed control device 20 so as to control movement of the vertical motion assembly 1.

Specifically, the collision signal detection and protection assembly is signal-connected to the control device. The control device receives the warning and protection signals and, based thereon, outputs the control signal to the speed control device 20 so as to control movement of the vertical motion assembly 1. The movement of the vertical motion assembly 1 actuates the horizontal motion assembly such that strong collision between the horizontal motion assembly and a wafer stage is prevented.

With continued reference to FIGS. 1 and 2, the horizontal motion assembly comprises a securing disk 7, a triple-eccentric cam 16, a horizontal cylinder 13, one cam follower 17, at least one protective ring 4 and at least one protective clamp 5. The triple-eccentric cam 16 is secured to the securing disk 7 by means of a bearing 18 and can slide circumferentially on a cylindrical surface of the bearing 18. A number of eccentric grooves are evenly provided in the triple-eccentric cam 16. The horizontal cylinder 13 is coupled, at one end, to the securing disk 7 and, at the other end, to the triple-eccentric cam 16. The cam follower 17 is disposed in one of the eccentric grooves of the triple-eccentric cam 16. The protective clamp 5 is received in the securing disk 7 and coupled thereto by means of a linear guide (not shown) such that the protective clamp 5 is capable of radial movement forth and back along the linear guide with respect to the securing disk 7. The protective clamp 5 is, at one end, in fixed connection with the cam follower 17 and, at the other end, in contact connection with the protective ring 4. The cam follower 17 drives the protective clamp 5 to move forth and back radially in the securing disk, allowing pickup and release of the protective ring 4. In addition, the protective clamp 5 can provides overload protection for the protective ring 4.

Preferably, the horizontal cylinder 13 is coupled to the securing disk 7 by means of a first hinge shaft 14 and to the triple-eccentric cam 16 by means of a second hinge shaft 15.

Specifically, after the horizontal cylinder 13 is provided with gas, the horizontal cylinder 13 drives the triple-eccentric cam 16 to move circularly which thereby, in turn, drives the cam follower 17 moves radially by means of the eccentric grooves. Under the actuation of the cam follower 17, the protective clamp 5 moves radially relative to the securing disk 7 along the linear guide, allowing clamping or release of the protective ring 4 and hence achieving the transfer of the protective ring that is transferring thereof from or onto the wafer stage.

Referring to FIGS. 1 and 2, the vertical motion assembly 1 is a vertical cylinder that is fixed to a vertical fixation member 2 at the top and coupled to the flexible bumper assembly at the bottom by means of an adapter plate assembly 9.

Figure 3A:
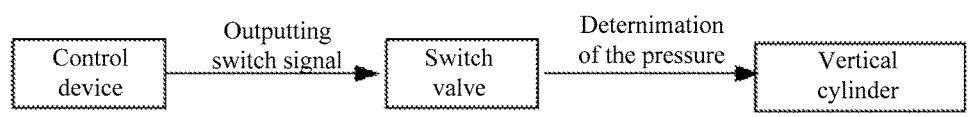
FIG. 3a schematically shows a speed control method for a conventional wafer edge protection device not equipped with any speed control device.
Figure 3B:
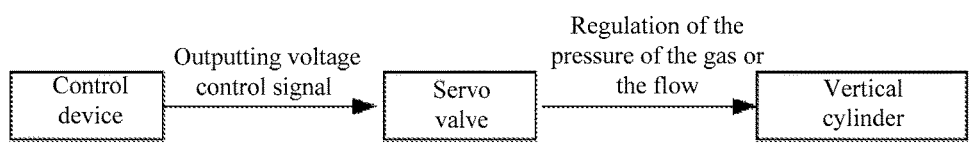
FIG. 3b schematically shows a speed control method for a wafer edge protection device incorporating a speed control device according to the present invention.

Referring to FIG. 3b, in conjunction with FIGS. 1 and 2, in this embodiment, the speed control device 20 is a servo valve provided in a gas supply 19 and signal-connected to the control device. During operation, the control device outputs a voltage control signal to the servo valve. Upon receipt of the voltage control signal outputting from the control device, the servo valve regulates the flow and pressure of the gas input to the vertical cylinder from the gas supply 19, as indicated by the signal, thereby controlling a speed at which the vertical cylinder drives the horizontal motion assembly to move.

Figure 4A:
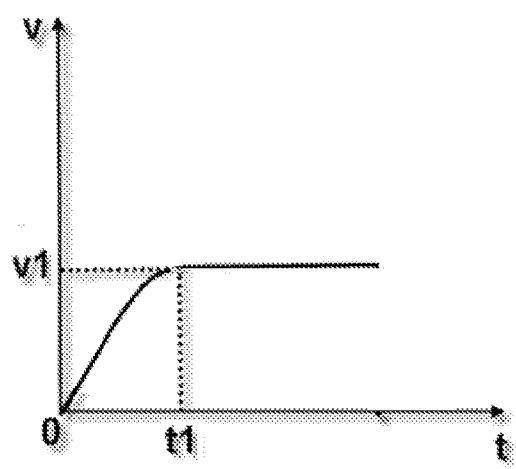
FIG. 4a schematically shows a speed profile of the conventional wafer edge protection device not equipped with any speed control device.
Figure 4B:
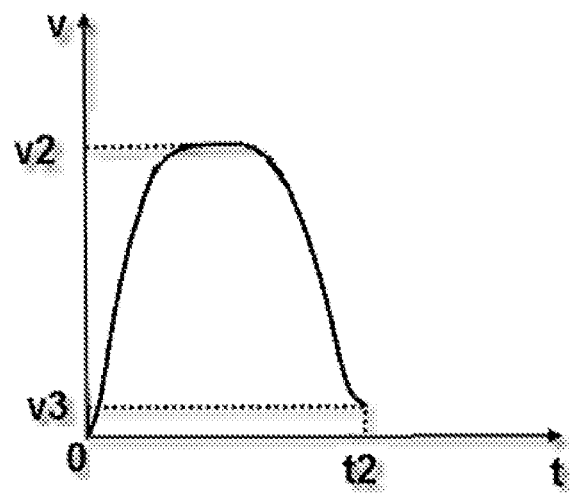
FIG. 4b schematically shows a speed profile of the wafer edge protection device incorporating the speed control device according to the present invention.

Referring to FIG. 4b, in conjunction with FIGS. 1 and 2, V2 represents a constant speed at which the wafer edge protection device moves in accordance with the present invention, and V3 denotes a speed of wafer edge protection device when the horizontal motion assembly approaches a position above the wafer stage or reaches a position suitable for transfer of the protective ring 4. Under the control of the control device with the aid of the speed control device 20, the vertical cylinder first accelerates to V2 and then keeps this speed until it moves with the horizontal motion assembly to a position close to the wafer stage. After that, it decelerates and when the horizontal motion assembly moves to the position above the wafer stage or reaches the position suitable for transfer of the protective ring 4, its speed has decreased to V3 (corresponding to the time instant t2 in FIG. 4b) that is much lower than V1. This leads to a reduction in the probability of collision between the horizontal motion assembly and the wafer stage, and pursuant to the kinetic energy formula $E=\frac{1}{2}mv^2$ (where, E is the kinetic energy, m is mass and v is velocity), when the mass of the horizontal motion assembly remains constant, a decrease in its speed can result in a reduction in the impact it exerts on the wafer stage during their collision. This prevents the application of an instantaneous strong impact by the horizontal motion assembly to the wafer stage and achieves reduced amplitude of vibration of the wafer edge protection device, thus avoiding crushing of the wafer by the horizontal motion assembly. As can be seen from FIGS. 4a and 4b, compared with the conventional arrangement without any speed control device, the speed control device 20 according to the present invention allows a significantly increased constant speed of the vertical cylinder (i.e., V2>V1) which results in a higher productivity. Therefore, incorporation of the speed control device 20 can provide protection for the wafer stage and wafer while ensuring a satisfactory productivity.

The flexible bumper assembly includes a flexible sheet 8 and a stop assembly for positionally limiting the flexible sheet 8. The flexible sheet 8 is connected, at the top, to the vertical motion assembly 1 and is in fixed connection, at the bottom, with the horizontal motion assembly. Preferably, the flexible sheet 8 is connected, at the top, to the vertical motion assembly 1 by means of the adapter plate assembly 9 and is in fixed connection, at the bottom, with the securing disk 7 of the horizontal motion assembly.

Preferably, the stop assembly includes at least two stopper rods 10, each in fixed connection, at the bottom, with the horizontal motion assembly and upwardly penetrating through the flexible sheet 8 and then the adapter plate assembly 9. The stopper rods 10 are each provided with a check nut 12 at their top so as to fasten each of the stopper rods 10. The check nuts 12 are provided to prevent the horizontal motion assembly and the vertical motion assembly 1 going away from each other and limiting a relative positional relationship between the horizontal motion assembly and the vertical motion assembly. The stopper rods 10 are provided evenly in the periphery of the flexible sheet 8, in order to achieve uniform positional limitation for the flexible sheet by the stop assembly. A stop washer 11 is provided around an upper portion of each stopper rod 10 and under the respective check nut 12. The stop washer 11 serves as a buffer for the check nut 12 so that the check nut 12 will not be tighten so much that it cannot be loosened.

Figure 5A:
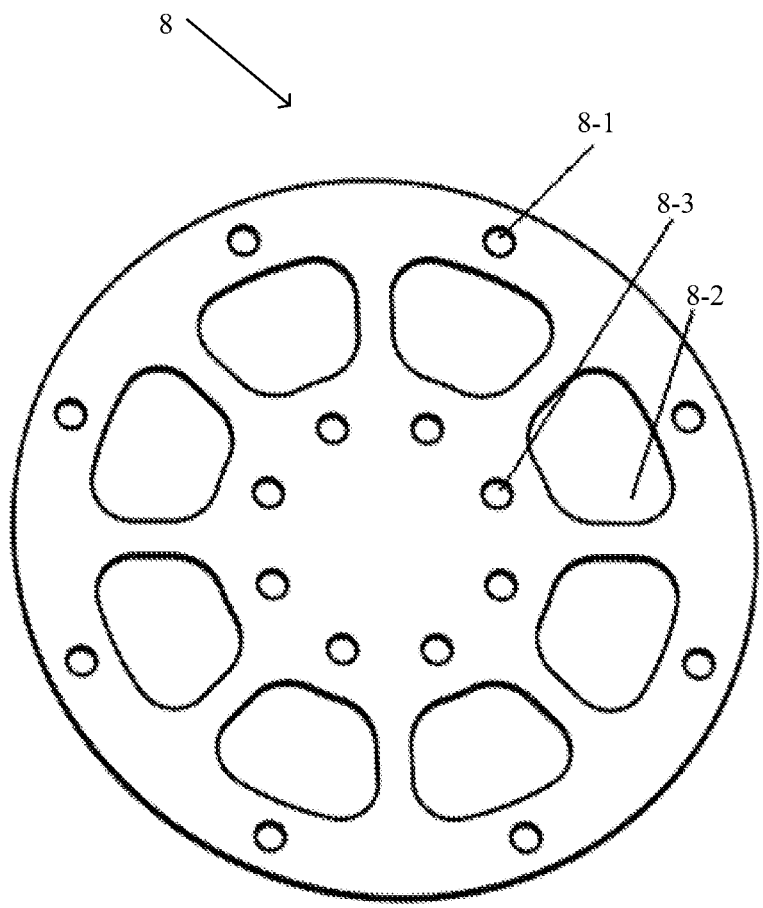
FIG. 5a is a structural schematic of a flexible sheet of a wafer edge protection device according to an embodiment of the present invention.

Referring to FIG. 5a, in conjunction with FIGS. 1 and 2, the flexible sheet 8 is circular and a number of ribs 8-2 arranged in a circular shape are provided on at least one surface of it in a circle. An inside portion of the flexible sheet 8 that is encircled by the ribs 8-2 is fixedly coupled to the adapter plate assembly 9, and an outside portion of the flexible sheet that is external to the plurality of ribs is fixedly coupled to the securing disk 7 of the horizontal motion assembly.

Preferably, the ribs 8-2 are fan-shaped. Alternatively, they may also assume any suitable shape. Outer holes 8-1 are formed external to the plurality of ribs 8-2, and inner holes 8-3 are formed internal to the plurality of ribs 8-2. The flexible sheet 8 is fixedly coupled to the adapter plate assembly 9 by screws at the outer holes 8-1 and to the securing disk 7 of the horizontal motion assembly by means of screws at the inner holes 8-3.

Figure 5B:
FIG. 5b schematically shows a flexible sheet of a wafer edge protection device under different conditions of movement according to an embodiment of the present invention.

Referring to FIG. 5b, in conjunction with FIGS. 1 and 2, in a steady state of the flexible sheet 8, under the effect of a tension from the horizontal motion assembly, the ribs 8-2 of the middle portion of the flexible sheet 8 flares and the whole flexible sheet 8 appears circular. For example, in FIG. 5b, 8a shows the flexible sheet 8 in such a steady state after the stop assembly being provided.

If the stop assembly is absent, when the horizontal motion assembly accelerates downward or is subject to an upward collision, the flexible sheet 8 will be not flared as much as in the steady state, as indicated by 8b in FIG. 5b. As a result, the horizontal motion assembly is too close to the vertical motion assembly 1. Additionally, when the horizontal motion assembly accelerates upward, the flexible sheet 8 will be more flared than in the steady state, as indicated by 8c in FIG. 5b, resulting in an excessive distance between the horizontal motion assembly and the vertical motion assembly 1.

With the stop assembly, flaring of the flexible sheet 8 is limited, avoiding an excess in the distance between the horizontal motion assembly and the vertical motion assembly 1. When the wafer edge protection device moves downward to a position suitable for transfer of the protective ring 4 with the wafer stage, the spacing between the horizontal motion assembly and the wafer stage is of only 0.4 mm. The stop assembly limits the degree of deformation of the flexible sheet 8 so that when the horizontal motion assembly and the vertical motion assembly 1 are moving away from each other, the stop assembly ensures a proper relative positional relationship between them, preventing an excess in the distance between them, downward movement of the horizontal motion assembly as a result of the deformation of the flexible sheet 8 and collision between the horizontal motion assembly and the wafer stage. It is further ensured that the flexible bumper assembly provides the same effect as the conventional rigid coupling during the transfer of the protective ring 4.

It is desirable that the flexible sheet 8 provides not only sufficient horizontal rigidity for preventing its twisting but also a vertical support for the gravity of the horizontal motion assembly and a degree of vertical flexible deformability and makes a suitable compromise therebetween. Rigidity of the flexible sheet 8 is adjustable through changes in its thickness, the number and width of the ribs 8-2. Preferably, a 1-mm thick flexible sheet 8 with eight 7-mm wide ribs is so rigid that when it is subject to an impact load of 100 N in the steady state, it is vertically displaced by 1 mm (i.e., the rigidity is 0.01 mm/N) and does not twist horizontally.

Figure 6A:
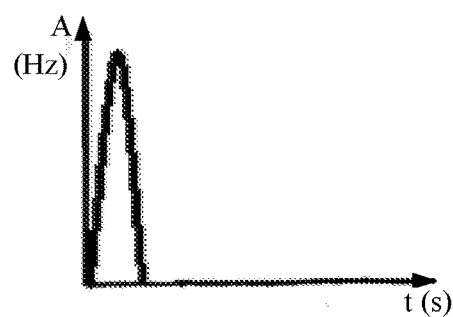
FIG. 6a schematically illustrates a signal of vibration caused by collision between a conventional wafer edge protection device and a wafer stage.
Figure 6B:
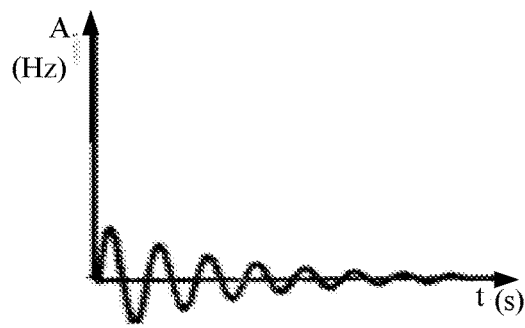
FIG. 6b schematically illustrates a signal indicating vibration of a horizontal motion assembly with respect to a vertical motion assembly upon collision between a wafer edge protection device and a wafer stage in accordance with one embodiment of the present invention.

Referring to FIG. 6b, in conjunction with FIGS. 1 and 2, similarly, the vertical axis A represents amplitude measured in hertz (Hz), and the horizontal axis t represents the time measured in second (s). Compared to the conventional "hard" collision generating an instantaneous strong impact, use of the flexible sheet 8 allows "soft" collision between the horizontal motion assembly and the wafer stage which lasts for a longer duration of time and leads to significantly reduced amplitude of vibration. As such, sufficient time is ensured for detection of the collision signal, facilitating the collision signal detection and protection assembly to issue a protection signal in a timely fashion so that controlling, by the control device, the vertical cylinder 1 taking a proper protective action for avoiding the wafer edge protection device from exerting an instantaneous strong impact on the wafer stage, reducing amplitude of vibration and preventing crushing of the wafer.

Referring to FIGS. 1 and 2, the collision signal detection and protection assembly includes at least one collision sensor 3 that is signal-connected to both the horizontal motion assembly and the vertical motion assembly 1. The collision sensor 3 is fixed to the wafer edge protection device by at least one sensor holder 6. Preferably, the collision sensor 3 is fixed to the adapter plate assembly 9 via the sensor holder 6. The collision sensor 3 is capable of detecting vibration of the horizontal motion assembly relative to the vertical motion assembly 1 during operation of the wafer edge protection device.

Specifically, if the vibration of the horizontal motion assembly relative to the vertical motion assembly 1 detected by the collision sensor 3 is below a threshold, the wafer edge protection device is left operating as it is supposed to. However, when the vibration exceeds the threshold, collision occurrence is determined and the collision sensor 3 generates a warning signal and a protection signal. The control device raises an alarm when receiving the warning signal.

The protection signal may either be a "rise" signal or a "stop" signal. The "rise" signal is generated when the wafer edge protection device moves vertically downward with the protective ring 4 clamped on the horizontal motion assembly. When the control device receives the "rise" signal from the collision sensor 3, it controls the wafer edge protection device to move upward with the aid of the speed control device 20 so that the wafer stage will be protected and the wafer will not be crushed.

The "stop" signal is generated when the wafer edge protection device is in other operating conditions. When the control device receives the "stop" signal from the collision sensor 3, it controls the wafer edge protection device to stop its movement with the aid of the speed control device 20 so as to crease the action toward collision in a timely way.

Various modifications and variations can be made by those skilled in the art to the present invention without departing from the spirit and scope of the invention. Accordingly, it is intended that the present invention includes such modifications and variations if they fall within the scope of the appended claims and the equivalents thereof.

What is claimed is:

1. A wafer edge protection device, comprising:
   a horizontal motion assembly;
   a vertical motion assembly;
   a speed control device, which is signal-connected to the vertical motion assembly and configured to adjust a speed of the vertical motion assembly;
   a flexible bumper assembly for connecting the horizontal motion assembly to the vertical motion assembly, configured to reduce an amplitude of vibration of the wafer edge protection device caused by a collision; and
   a control device, which is signal-connected to the speed control device and configured to output a control signal to the speed control device so as to control a movement of the vertical motion assembly.

2. The wafer edge protection device according to claim 1, further comprising a collision signal detection and protection assembly configured to detect a vibration signal of the horizontal motion assembly relative to the vertical motion assembly and to generate a warning signal and a protection signal based on the vibration signal; the collision signal detection and protection assembly is signal-connected to the control device; the control device receives the warning and protection signals and, based on the signals, outputs the control signal to the speed control device so as to control the movement of the vertical motion assembly.

3. The wafer edge protection device according to claim 2, wherein the collision signal detection and protection assembly comprises at least one collision sensor signal-connected to both the horizontal motion assembly and the vertical motion assembly.

4. The wafer edge protection device according to claim 3, wherein the at least one collision sensor is fixed to the wafer edge protection device through at least one sensor holder.

5. The wafer edge protection device according to claim 1, wherein the horizontal motion assembly comprises:
   a securing disk;
   a triple-eccentric cam secured to the securing disk through a bearing, wherein at least one eccentric groove is evenly provided in the triple-eccentric cam;
   a horizontal cylinder having a first end in connection with the securing disk and a second end in connection with the triple-eccentric cam;
   at least one cam follower disposed in the at least one eccentric grooves in the triple-eccentric cam; and
   at least one protective clamp received in the securing disk, each of the at least one protective clamp having a first end in fixed connection with a corresponding one of the at least one cam follower and a second end for pick-up or release of a protective ring.

6. The wafer edge protection device according to claim 5, wherein the horizontal cylinder has a first end coupled to the securing disk through a first hinge shaft and a second end coupled to the triple-eccentric cam through a second hinge shaft.

7. The wafer edge protection device according to claim 1, wherein the vertical motion assembly has a top end coupled to a vertical fixation member and a bottom end coupled, via an adapter plate assembly, to the flexible bumper assembly.

8. The wafer edge protection device according to claim 7, wherein the vertical motion assembly is a vertical cylinder.

9. The wafer edge protection device according to claim 1, wherein the speed control device is a servo valve provided on a gas supply.

10. The wafer edge protection device according to claim 1, wherein the flexible bumper assembly comprises a flexible sheet and a stop assembly for positionally limiting the flexible sheet, the flexible sheet being in connection with the vertical motion assembly and being in fixed connection with the horizontal motion assembly.

11. The wafer edge protection device according to claim 10, wherein the flexible sheet is connected to the vertical motion assembly through an adapter plate assembly.

12. The wafer edge protection device according to claim 11, wherein the flexible sheet is circular, wherein a plurality of ribs arranged in a circular shape are provided on at least one surface of the flexible sheet, and wherein an inside portion of the flexible sheet that is encircled by the plurality of ribs is fixedly coupled to the adapter plate assembly and an outside portion of the flexible sheet that is external to the plurality of ribs is fixedly coupled to the horizontal motion assembly.

13. The wafer edge protection device according to claim 12, wherein a plurality of outer holes are formed external to the plurality of ribs and a plurality of inner holes are formed internal to the plurality of ribs, wherein the flexible sheet is fixedly coupled to the adapter plate assembly through a plurality of first screws at the plurality of outer holes and to the horizontal motion assembly through a plurality of second screws at the plurality of inner holes.

14. The wafer edge protection device according to claim 12, wherein each of the plurality of ribs is fan-shaped.

15. The wafer edge protection device according to claim 10, wherein the stop assembly comprises at least two stopper rods, each of the at least two stopper rods having a bottom end in fixed connection with the horizontal motion assembly, the at least two stopper rods penetrating upward successively through the flexible sheet and an adapter plate assembly, the at least two stopper rods being provided with a check nut at a top end thereof.

16. The wafer edge protection device according to claim 15, wherein the at least two stopper rods are provided evenly in a periphery of the flexible sheet.

17. The wafer edge protection device according to claim 15, wherein a stop washer is provided around an upper portion of each of the at least two stopper rods.

* * * * *